US006576989B1

(12) United States Patent
Hong et al.

(10) Patent No.: US 6,576,989 B1
(45) Date of Patent: Jun. 10, 2003

(54) LOCKING OF MOLD COMPOUND TO CONDUCTIVE SUBSTRATE PANELS

(75) Inventors: Harry Kam Cheng Hong, Melaka (MY); Hu Ah Lek, Melaka (MY); Santhiran Nadarajah, Melaka (MY); Sharon Ko Mei Wan, Melaka (MY); Chan Peng Yeen, Melaka (MY); Jaime Bayan, Palo Alto, CA (US); Peter Howard Spalding, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/724,727

(22) Filed: Nov. 28, 2000

(51) Int. Cl.$^7$ ............................................. H01L 23/02
(52) U.S. Cl. ...................... 257/678; 257/678; 257/680; 257/683; 257/685; 257/704; 257/723; 257/731
(58) Field of Search ................... 257/678, 683, 257/704, 723, 685, 731, 680

(56) References Cited

U.S. PATENT DOCUMENTS

| | | | | |
|---|---|---|---|---|
| 3,658,596 A | * | 4/1972 | Osborne | 136/251 |
| 3,823,350 A | * | 7/1974 | Stoner | 439/68 |
| 3,846,734 A | * | 11/1974 | Pauza et al. | 439/70 |
| 4,679,870 A | * | 7/1987 | Pretchel | 439/493 |
| 4,688,870 A | * | 8/1987 | Egawa et al. | 439/331 |
| 5,043,695 A | * | 8/1991 | Simon et al. | 338/199 |
| 5,095,298 A | * | 3/1992 | Chapman et al. | 338/162 |
| 5,278,445 A | * | 1/1994 | Uemura et al. | 257/678 |
| 5,652,185 A | * | 7/1997 | Lee | 438/113 |
| 5,692,637 A | * | 12/1997 | Hodge | 220/366.1 |
| 5,754,408 A | * | 5/1998 | Derouiche | 361/773 |
| 5,801,335 A | * | 9/1998 | Brussalis et al. | 174/138 G |
| 6,061,243 A | * | 5/2000 | Barnett et al. | 361/704 |
| 6,284,572 B1 | * | 9/2001 | Cantillep et al. | 438/112 |
| 6,476,478 B1 | * | 11/2002 | Swiss et al. | 257/692 |
| 6,476,885 B1 | * | 11/2002 | Murray et al. | 349/60 |
| 6,483,180 B1 | * | 11/2002 | Bayan et al. | 257/684 |
| 2001/0026255 A1 | * | 10/2001 | Sano et al. | 345/60 |
| 2002/0018172 A1 | * | 2/2002 | Alwan | 349/187 |

* cited by examiner

Primary Examiner—Amir Zarabian
Assistant Examiner—Ida M. Soward
(74) Attorney, Agent, or Firm—Beyer Weaver & Thomas LLP (57) ABSTRACT

A panel assembly of packaged integrated circuit devices including conductive substrate panel having an array of device areas and a plurality of locking passageways. The locking passageways are positioned about an inactive buffer area which surrounds the periphery of the array of device areas. The locking passageways extend from a topside of the panel toward a bottom side of the panel. The panel assembly also includes a molded cap that is molded over the topside of the panel to encapsulate the array of device areas and the inactive buffer area. The molded cap includes conforming locking stem portions that extend into each of the locking passageways in a manner locking the molded cap to the substrate panel such that during singulation of the device areas, the molded cap will not separate from the substrate panel at the inactive buffer area. In another aspect of the invention, a method for producing the panel assembly having the locking passageways is described. The method involves providing a conductive substrate panel having the locking passageways and applying molding material to the topside of the substrate panel such that the solidified molding material forms stems that conform to the passageways.

21 Claims, 7 Drawing Sheets

LOCKING OF MOLD COMPOUND TO CONDUCTIVE SUBSTRATE PANELS

FIELD OF THE INVENTION

The present invention relates generally to semiconductor manufacturing, and more specifically to the manufacturing of leadless leadframe semiconductor packages.

BACKGROUND

Semiconductor integrated circuits (IC's) are typically fabricated in wafer form. After the wafers are fabricated, individual die are cut from the wafer and then packaged. One method of packaging the die involves attaching multiple die, or dice, onto panels that contain arrays of leadless leadframes. Generally, a leadless leadframe includes multiple sets of electrical contact landings wherein a die is electrically connected to each of the contact landings within a set. The contacts provide the physical connection between the input and output terminals of the die and those of the circuit board. Molding material is then applied to encapsulate the die and to fix the orientation of the contact landings. While the molding material sufficiently encapsulates the arrays of the leadless leadframes and the semiconductor dies, it is typically not extended to the outer most edges of the panel. After the molding compound solidifies into the shape of molding panels, each packaged die is cut from the molded panel assembly (e.g. "singulated") using a circular saw blade. The circular saw blade generally is guided through paths that form rows and columns along the molded panel assembly.

Figure 1:
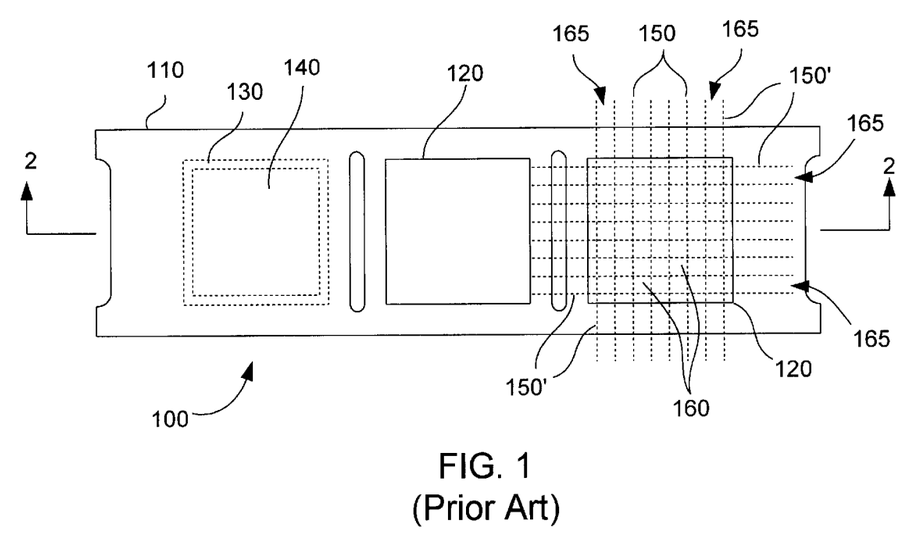
FIG. 1 illustrates a top plan view of a molded panel assembly as known in the prior art.
Figure 2:
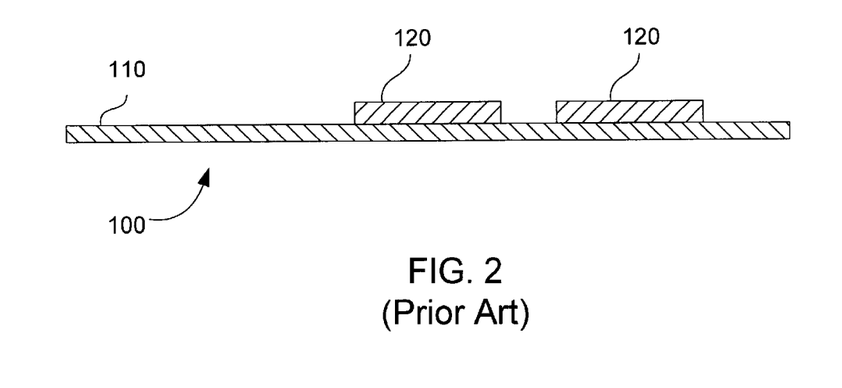
FIG. 2 illustrates a side elevation view of the molded panel assembly taken substantially along the plane of the line 2—2 in FIG. 1.

By way of example, FIGS. 1 and 2 illustrate one embodiment of a molded panel assembly 100 as known in the prior art. The molded panel assembly 100 includes a conductive substrate panel 110, which is generally a flat metal substrate configured to provide the electrical contacts (not shown) for the packaged semiconductor devices that are to be manufactured. Formed within the substrate panel 110 are multiple active areas 140 within which semiconductor dies will be attached. Each of these multiple active areas 140 contain an array of semiconductor device areas. Within each of these device areas, multiple semiconductor dies (not shown) will be positioned proximate to corresponding sets of the electrical contacts. The active areas 140 and the semiconductor dies are flood molded with molding material to form a relatively flat molding panel or cap 120. Although the molding material is not flood molded to the outermost edges of the substrate panel 110, it is extended to inactive buffer areas 130 beyond the perimeter of the active areas 140. This assures that the components of the outermost semiconductor packages are sufficiently encapsulated.

The individual, packaged semiconductor devices 160 are then typically singulated from molded panel assemblies by running a circular saw blade along the singulation paths 150. These paths 150, represented by dashed lines, indicate the path along which the packaged semiconductor devices 160 are separated from the molded panel assembly 100

Figure 3:
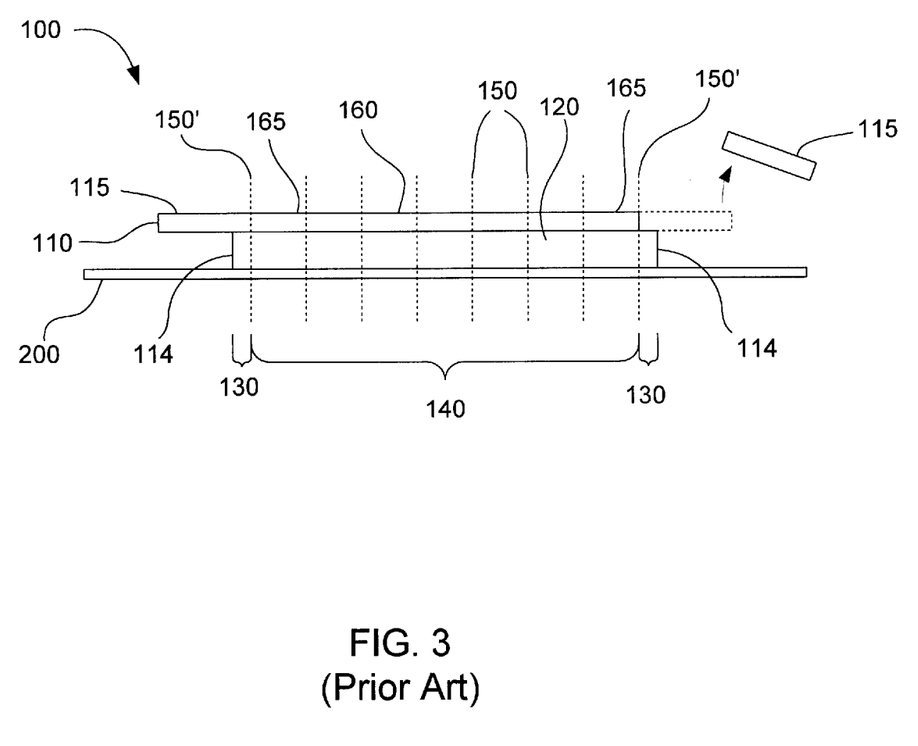
FIG. 3 illustrates an enlarged side elevation view of the molded panel assembly of FIG. 1 in which an outer piece of the substrate panel separates from the molding panel.

To facilitate singulation, as shown in FIG. 3, a contact tape 200 is adhered to the molded caps 120 of the panel assembly 100 to retain the individual, packaged semiconductor devices 160 in place during singulation. Essentially, the tape increases the overall structural integrity of the panel assembly so that the singulated components will not inadvertently detach or fracture during the singulation process. While this technique has proven adequate to prevent such inadvertent detachment of the individual semiconductor devices 160, in most instances, problems occur when singulating the four outer singulation paths 150 at the peripheral edge portions of the molded cap. As can be seen in FIGS. 1 and 3, the outer perimeter of molding panel 120 extends out to the edge of the buffer areas 130, but does not fully extend to the perimeter edge of the substrate panel 110 for the reasons above-mentioned. The outer edge regions 115 of the substrate panel 110, hence, substantially overhangs the molding panel 120. This arrangement is problematic when the singulation saw passes through these regions since the portion of the molding panels that are adhered to these outer panel edges is relatively small compared to the overhanging edge regions 115.

Accordingly, as the rotating saw blade cuts therethrough, the forces exerted by the blade upon the molding panel 120 and the substrate panel 110 may cause separation between the singulated outer peripheral edge 114 of the molding panel 120 and the singulated outer edge region 115 (FIG. 3) of the panel 110. These detached projectiles 115 are not only dangerous, but they can sever wiring, damage the panel or packaging, and/or cause processing errors or contamination within the manufacturing process. For example, the detached pieces of the substrate panel 110 may cause blade failure, premature wear or blade breakage.

The current technique to address these problems is to avoid passing the saw blade along the four outer singulation paths 150' altogether. Although the outer edge region 115 of the substrate panel 110 is more securely attached to the molding panel 120, the outer rows and columns 165 of each active area 140 no longer yields packaged semiconductor devices 160. Consequently, a substantial percent of perfectly functional semiconductor packages 160 are discarded.

Another solution is to merely further extend the molding material beyond the outer rows and columns 165 of the outermost semiconductor packages 160. Accordingly, the buffer area 130 of the outer molded panel becomes substantially larger and is therefore attached to the outer edge region 115 of the substrate panel 110 by a greater amount of surface area. Not only does this increase material costs, but the blade wear rate will also be increased.

Accordingly, in view of the foregoing, a molded panel assembly is desirable which minimizes separation of the outer edges portions of the substrate panel from the molding panel during a singulation process, and which increases the yield of usable semiconductor package devices.

SUMMARY

The present invention is directed to an apparatus and a method that substantially eliminates the separation of inactive edge portions of the substrate panel from their corresponding molding edge portions during the singulation process. This is performed by a panel assembly of packaged integrated circuit devices which include a conductive substrate panel having an array of device areas and a plurality of locking passageways. The locking passageways are positioned about an inactive buffer area, which surrounds the periphery of the array of device areas. The locking passageways extend from a topside of the panel toward a bottom side of the panel. A molded cap is then molded over the topside of the panel to encapsulate the array of device areas and the buffer area. The molded cap includes conforming locking stem portions that extend into each of the locking passageways in a manner locking the molded cap to the substrate panel.

Accordingly, the molded mounting stems substantially increase the structural bond between the inactive edge portions of the substrate panel and the molding edge portions of the molded cap. Thus, during the singulation process of the device areas, the singulated molded cap and corresponding substrate panel will remain intact at these inactive buffer areas.

In another aspect of the invention, a method for producing the panel assembly having the locking passageways is described. The method involves providing a conductive substrate panel having the locking passageways and applying molding material to the topside of the substrate panel such that the solidified molding material forms stems that conform to the passageways.

These and other features and advantages of the present invention will be presented in more detail in the following specification of the invention and the accompanying figures which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 4:
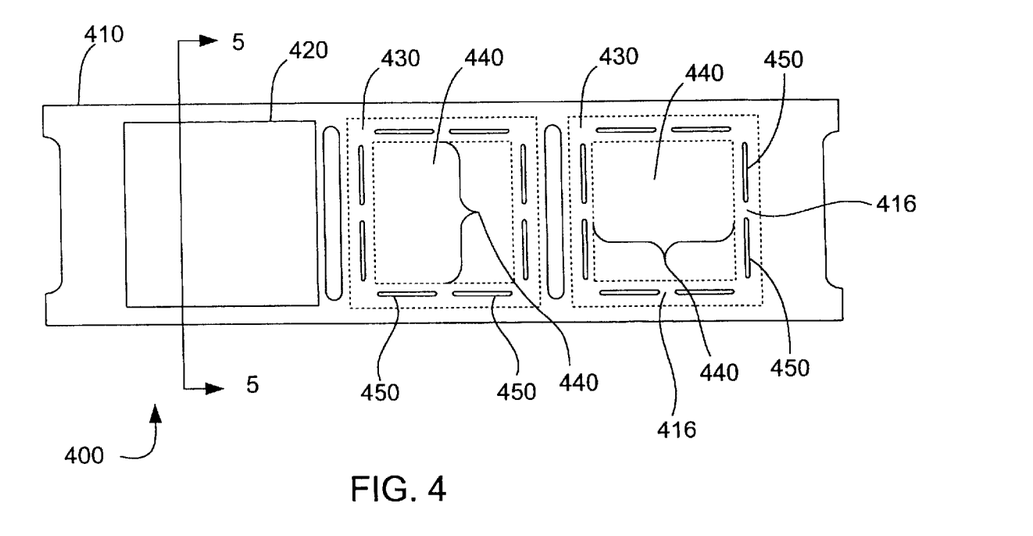
FIG. 4 illustrates a top plan view of a molded panel assembly constructed in accordance with the present invention.
Figure 5:
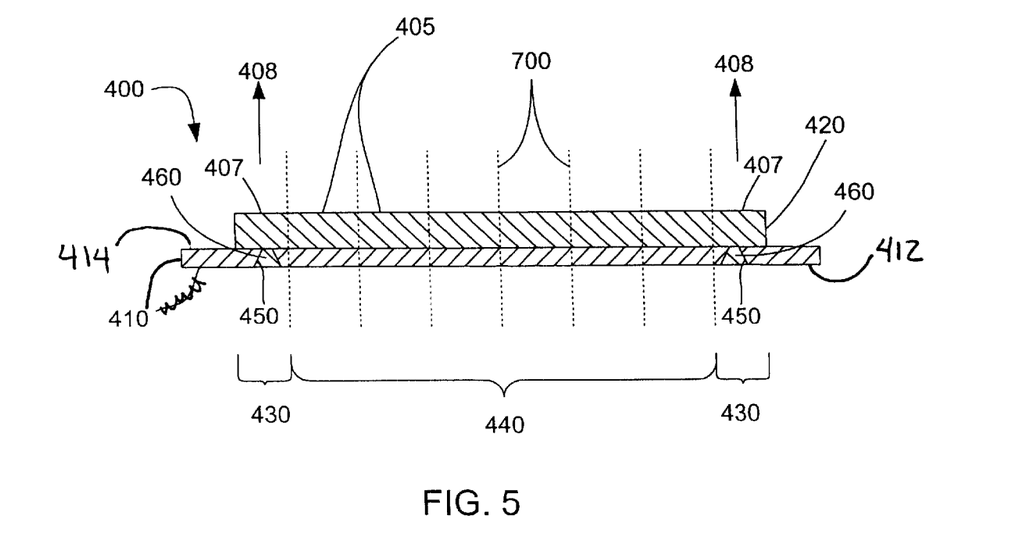
FIG. 5 illustrates an enlarged side elevation view, in cross-section, of the molded panel assembly taken substantially along the plane of the line 5—5 in FIG. 4.

Referring now to FIGS. 4 and 5, a panel assembly, generally designated 400, is illustrated for packaged integrated circuit devices 405. The panel assembly 400 includes a conductive substrate panel 410 having at least one array of device areas 440. The substrate panel 410 further defines a plurality of locking passageways, generally designated 450, positioned about an inactive buffer area 430 which surrounds the periphery of the array 440 of device areas. The locking passageways 450, as shown in FIG. 5, extend inwardly from a topside 414 of the panel toward a bottom side 412 thereof. A molded cap or panel 420 is molded over the panel topside 414 to encapsulate the device areas of the array 440 and the inactive buffer area 430. The molded cap 420 further includes conforming locking stem portions 460 that extend into each of the locking passageways 450 in a manner locking the molded cap 420 to the substrate panel 410 such that during singulation of the device areas, the singulated outer peripheral portions 407 of the molded cap will not separate from the substrate panel at the inactive buffer areas 430.

Accordingly, the molded mounting stems 460 of the molded cap 420 cooperate with the locking passageways 450 to retain the singulated outer peripheral portions 407 of the molded cap 420 to the singulated buffer area 430 of the substrate panel 410. Essentially, interlocking between the locking stems 460 and the locking passageways 450 substantially increase the structural bond integrity between the inactive buffer area 430 of the substrate panel 410 and the singulated outer peripheral portions 407 of the molded cap 420. Thus, during the singulation process of the device areas, the singulated molded cap and corresponding substrate panel will remain intact at these inactive buffer areas.

These stems 460 are preferably elongated and extend along the periphery of the array 440 of device areas. For example, the embodiment of FIG. 4 illustrates two spaced-apart locking passages 450 extending generally parallel to their respective peripheral edge of the array 440. The spacing between the adjacent locking passageways 450 must not be too large as to fail to prevent separation between singulated molded cap portions 407 and the singulated inactive buffer area 430.

Referring back to FIG. 4, generally, the substrate panel 410 is generally provided by a plate or flat metal substrate material. The substrate panel 410 includes three active areas or array 440 of individual device areas. It is noted that substrate panels may have more or less active areas 440 than are shown in FIG. 4. Multiple active areas 440 may also be arranged in rows and columns. Each of the device areas contain a plurality of electrical contacts (not shown) to which semiconductor dies will be connected after the dies are placed in respective device areas on the topside 414 of the panel substrate. Each of the active areas or arrays 440 of the substrate panel 410 are surrounded by the inactive buffer area 430. Semiconductor dies (not shown), as mentioned, are not placed within the inactive buffer areas 430. Molding panels or caps 420 are applied to the topside 414 of the substrate panel 410 such that each panel 420 will cover a respective set of active 440 and inactive buffer areas 430. The molding panels 420 provide mechanical protection to the semiconductor dies. As is generally known in the art, the semiconductor dies may be attached to the electrical contacts through copper interconnecting wires.

In the preferred embodiment, the molding panels 420 are formed through injection molding or flood molding techniques wherein liquefied molding material is applied to the substrate panels 410. In the present invention, the liquefied molding material flows into the topside openings of the passageways 450 (on the topside 414 of the substrate panel 410) such that the passageways 450 become filled with molding material. Upon solidification of the molding material, the material within the passageways 450 form the mounting stems 460 (see FIG. 5) integral with the molded cap 420. The stems 460 extend from the molding panel 420 and conform to the shape of the passageways 450. During the fabrication process, a contact tape (not shown) may be applied to the bottom side 412 of the substrate panel so to prevent the molding material from flowing past the bottom side opening of the passageways 450. In this manner, the stems 460 are flush with the bottom side 412 of the substrate panel 410.

As above-indicated, the locking passageways 450 and the mounting stems cooperate to lock the singulated outer peripheral portions 407 of the molded cap 420 to the singulated inactive buffer areas 430. This is primarily performed by creating a sufficient friction interference therebetween to prevent separation during singulation. As can be seen in FIG. 5, the stem 460, via the passageway 450, tapers outwardly from the topside 414 to the bottom side 412 of the substrate panel 410. Thus, the width or surface area of the stem 460 proximate to the bottom side 412 is sufficiently larger than the width or surface area of passageway 450 at the top side 414, creating wedged or interfering contact between the tapered passageways 450 and the stems 460. This functions to prevent pull-out of the stems from the passageway in the direction of arrow 408.

To avert such sliding separation, the width differential between the greatest width and the smallest width sufficient to avert sliding separation, is dependent upon several factors such as the rigidity of the materials, the length and number of the stems and the height or thickness of the substrate panel 410. For instance, a smaller vertical height between the greatest width and the smallest width would require a greater width differential, while a greater vertical height difference could provide the sufficient retainment qualities with smaller width differential. Generally, this is because the surface area, and thus, the frictional interference is increased when these locking features are spaced further apart. However, since these panels are relatively thin, generally about 0.006 inches to about 0.009 inches thick, the ratio between the greatest width of the mounting stem 460 to the smallest width of the passageway 450 is in the range of about 1.1 to about 2.0. Such a ratio should sufficiently prevent separation during singulation by the circular saw. Moreover, while FIG. 5 illustrates the greatest width at the bottom side 412 of the panel 410 and the smallest width at top side 414, any configuration may be employed as long as the sufficient interference is attained.

Figure 6:
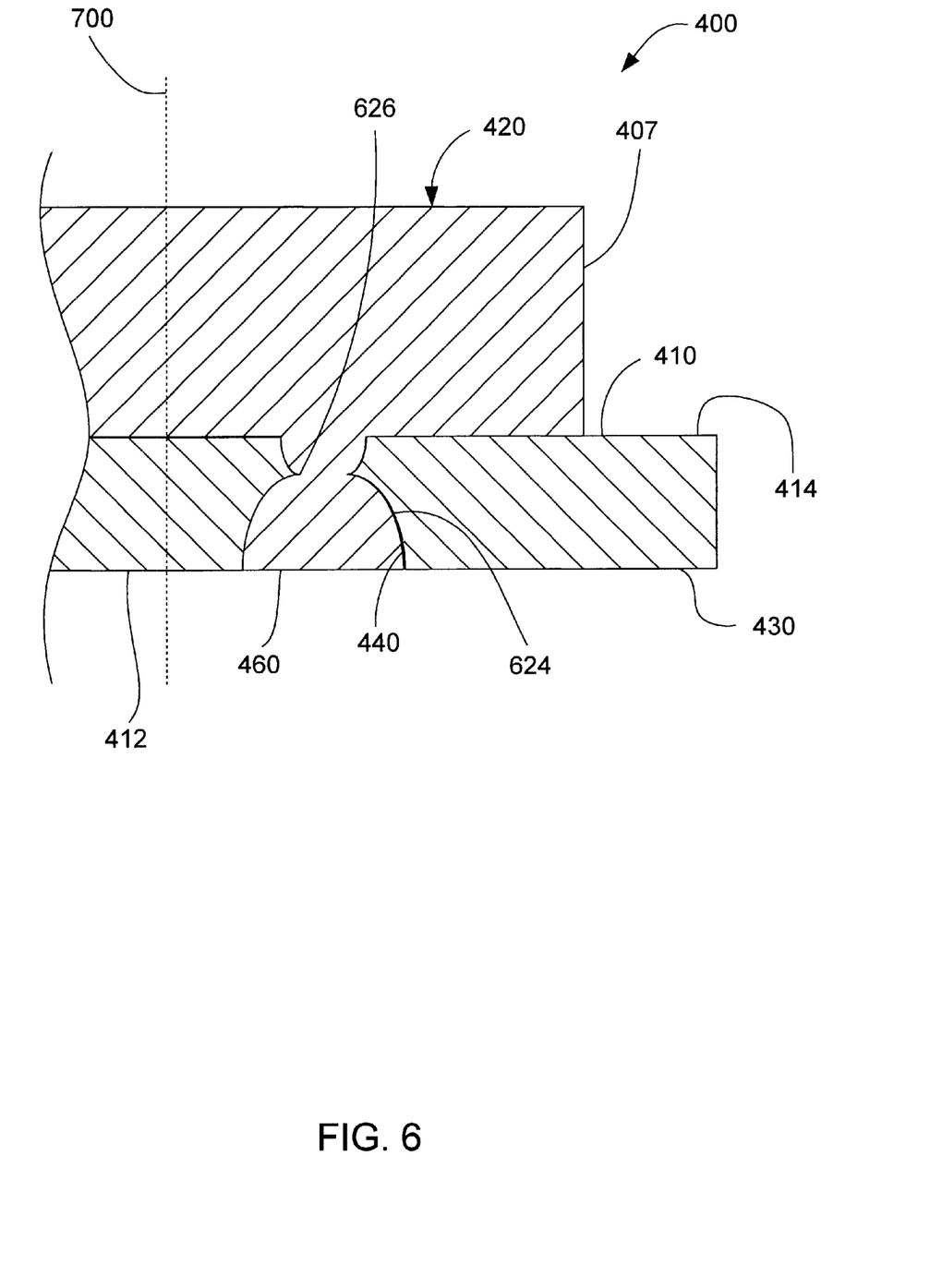
FIG. 6 illustrates a fragmentary, enlarged, side elevation view, in cross-section, of a locking passageway according to one embodiment of the invention.

For example, FIG. 6 illustrates an alternative embodiment locking passageway 450 and mounting stem 460 formed by applying half-etch techniques from opposed sides of the substrate panel 410. Briefly, the molding panel 420 is bonded to the topside 414 of a substrate panel 410. The stems 460 extend into the passageways 450 from the molding panel or cap 420 and conform to the shape of the passageways 450 during molding. In this configuration, the smallest width dimension of the passageway 450 is positioned between the topside 414 and the bottom side 412 of the substrate panel 410, at a height H from the bottom side. This locking section 624 of the mounting stem has a much larger side transverse cross-sectional area than that at the smallest width dimension of the stem at region 626 upper end at the bottom side 412, is thus located central to the passageway. It will be appreciated, however, that the region 626 of the smallest width dimension may be oriented anywhere along the axial length passageway 450. Further, it may also be apparent to those of ordinary skill in the art that the cross-sectional dimension of the locking section 624 of the mounting stem 460 may be of various shapes. For instance, the cross-section shape of the passageway 450 may be more parabolic (FIG. 6) or it may be more trapezoidal similar to that shown in FIG. 5.

As mentioned above, the locking passageways 450 of FIG. 6 are formed through a chemical half-etching technique applied to both the bottom side 412 and the topside 414 substrate panel 410. As the chemical etching deepens the respective recess from the opposed sides, the co-aligned recesses eventually communicate with each other. To form the locking section 624, the exposure time of the bottom side 412 of the substrate panel 410 to the chemical etchant may be increased, as compared to that on the topside 414. Another etching technique would be to apply pressure to the chemical etchant.

It is noted that the locking passageways need not pass completely through the conductive substrate panel. For instance, a locking passageway having a topside entrance or opening on the topside of the substrate panel, without extending completely to the bottom side of the substrate panel, may still function to lock the molding panel onto the substrate panel. Such a locking passageway may have a hooked or an "L" shape. The corresponding molding stems that conform to these passageways would serve to lock the mold panel to the substrate panel.

Figure 7:
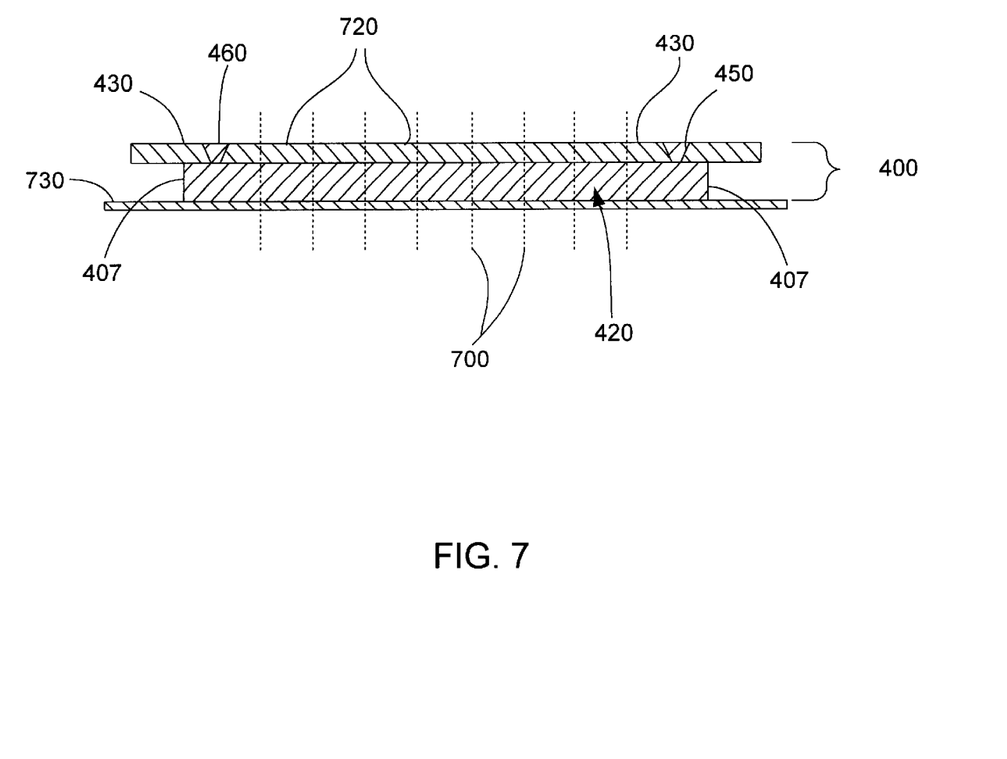
FIG. 7 illustrates an inverted, side elevation view, in cross-section, of the molded panel assembly of FIG. 5, adhered to contact tape.

Referring now to FIG. 7, the molded panel assembly 400 is illustrated wherein the molded panels 420 of the leadframe 400 are attached to a contact tape 730. Similar to the current designs, the contact tape 730 serves to secure the molded panel assembly 400 in a fixed orientation to facilitate the singulation process. Dashed lines 700 represent the singulation paths along which a saw blade will pass in order to singulate the individual semiconductor devices 720. As can be appreciated by those of skill in the art, the saw blade will also pass through singulation paths that run parallel to the plane of the page such that the molded panel assembly 400 will be cut into individual semiconductor packages. The outer peripheral portions 407 of the substrate panel 410 are locked to the molding panel 420 through the passageway 450 and the stem 460, and also through the inherent adhesive characteristic of the molding material. Since the molded panel assembly 400 is adhered to the contact tape 730, the outer peripheral portions 407 of the substrate panel 410 are further secured to prevent separation during the singulation process.

The number and size of passageways 450 formed on a leadframe 410 may vary depending factors such as manufacturing constraints and the spacing between each of the singulation paths. As mentioned, at least one elongated mounting stem locking 460 extends generally or adjacent to a corresponding outer peripheral edge of the array 440. Thus, in a four-sided array 440, there are at least four mounting stems 440. However, to maintain adequate structural integrity of the substrate panel 410 in the inactive buffer area 430, at least one bridge portion 416 (FIG. 4) is included which divides the passageway into two passageways along each array edge.

Figure 8:
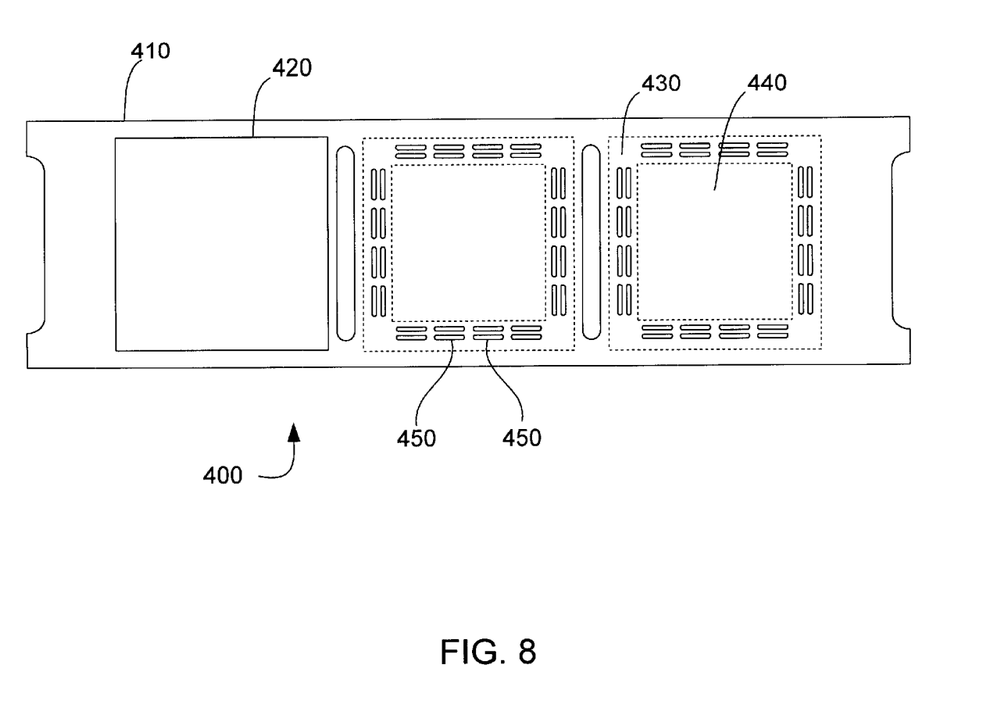
FIG. 8 illustrates a top plan view of an alternative embodiment of the molded panel assembly of the present invention, having parallel positioned mounting stems.

Alternatively, as viewed in FIG. 8, the molded panel assembly 400 includes multiple rows of elongated passageways 450 in each of the buffer areas 430, which extend along the edge of the array 440. This increase of rows of passageways, consequently, increases the number of mounting stems 460 which in turn provides bond strength between the singulated outer peripheral portions 407 of the molded cap 420 and the singulated buffer areas 430 of the substrate panel 410. Other distribution patterns, of course, may be provided, such as staggering of passageways in adjacent rows (not shown) as opposed to the aligned passageway rows of FIG. 8. Further, the number of passageway pairs may vary depending upon factors such as the size of the individual semiconductor devices to be singulated from the molded panel assembly 700.

Figure 9:
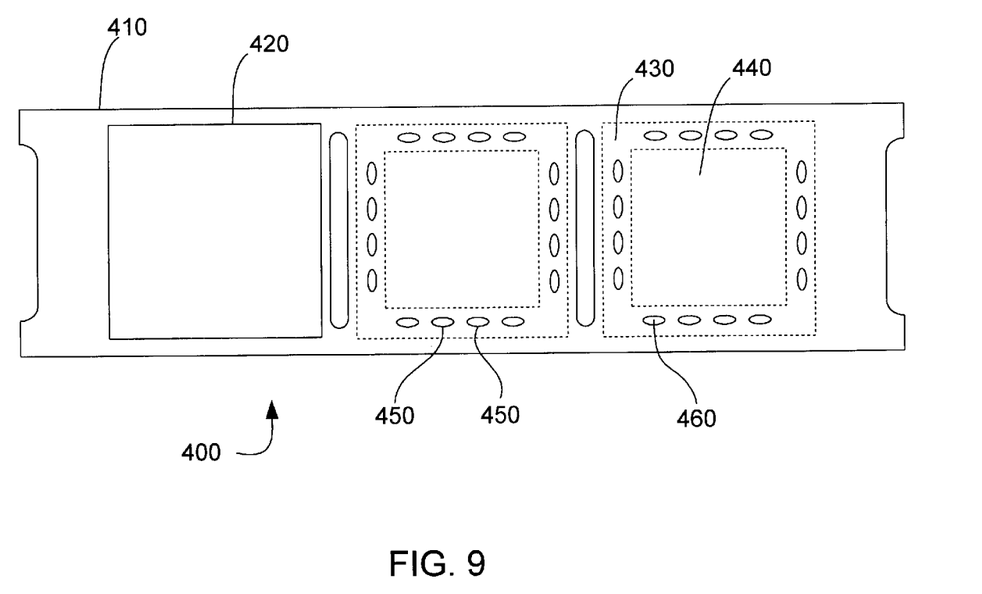
FIG. 9 illustrates a top plan view of an alternative embodiment of the molded panel assembly of the present invention, having elliptical shaped mounting stems.

In yet another alternative configuration, the top transverse cross-sectional shape of each passageway 450 may also be formed in a variety of shapes, such as elongated ovals, circles, squares, etc. By way of example, FIG. 9 illustrates a top plan view of passageways 450 and the corresponding mounting stems 460, which are oval-shaped in the top transverse cross-sectional dimension. Note that the corner regions of the buffer areas 430 may contain locking passageways of various shapes. For example, the corner region of the buffer areas 430 may contain L-shaped locking passageways such each of the ends of the passageways extend along different edges of the buffer area 430.

While this invention has been described in terms of several preferred embodiments, there are alteration, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A panel assembly of packaged integrated circuit devices comprising:

a conductive substrate panel having at least one array of device areas, and defining a plurality of locking passageways positioned about an inactive buffer area which surrounds the periphery of the array of device areas, said locking passageways extending inwardly from a topside of the panel toward a bottom side thereof; and a molded cap that is molded over the panel topside to encapsulate the device areas of the array and the inactive buffer area, said molded cap further having integrally formed, conforming locking stem portions that extend into each of the locking passageways such that each of the locking stems have substantially the same shape and size as the locking passageway into which each of the locking stems extend, the locking stems configured to lock the molded cap to the substrate panel such that during singulation of the device areas, said molded cap will not separate from the substrate panel at the inactive buffer area.

2. The panel assembly as recited in claim 1 wherein each locking passageway includes a lock section having a transverse cross-sectional dimension larger than that at a topside entrance into the respective locking passageway such that a corresponding lock section of the corresponding stem has a larger transverse cross-sectional dimension than a corresponding section of the stem at the topside entrance into the passageway.

3. The panel assembly as recited in claim 1 wherein each locking passageway has a bottom side entrance that has a cross-sectional dimension larger than that of a topside entrance, the corresponding stem having a cross-sectional dimension at the bottom side entrance that is larger than a cross-sectional dimension at the topside entrance.

4. The panel assembly as recited in claim 1 wherein at least one of the locking passageways defines a transverse cross-sectional area substantially having the shape of an elongated oval, a circle, a square or an "L".

5. The panel assembly as recited in claim 1 wherein at least two of the locking passageways are grouped together such that the at least two locking passageways are positioned proximate to each other.

6. The panel assembly as recited in claim 1 further comprising an adhesive tape that is attached to the mold cap.

7. The panel assembly as recited in claim 1 wherein each of the device areas contains a semiconductor die, a plurality of electrical contacts positioned adjacent to the semiconductor die, and a plurality of interconnecting wires that connect the semiconductor die to each of the electrical contacts.

8. A panel assembly for packaged integrated circuit devices having a molded cap comprising:

a conductive substrate panel having at least one array of device areas, and defining a plurality of locking passageways positioned about an inactive buffer area that peripherally surrounds the array of device areas, said locking passageways extending inwardly from a topside of the panel toward a bottom side thereof, wherein when the molded cap is molded over the panel topside to encapsulate the device areas of the array and the inactive buffer area, a conforming locking stem portion is integrally formed with the molded cap and extends into each locking passageway such that each of the locking stems have substantially the same shape and size as the locking passageway into which each of the locking stems extend, the locking stems configured to lock the molded cap to the substrate panel such that during singulation of the device areas, said molded cap will not separate from the substrate panel at the inactive buffer area.

9. The panel assembly as recited in claim 8 wherein each locking passageway includes a lock section having a transverse cross-sectional dimension larger than that at a topside entrance into the respective locking passageway such that a corresponding lock section of the corresponding stem has a larger transverse cross-sectional dimension than a corresponding section of the stem at the topside entrance into the locking passageway.

10. The panel assembly as recited in claim 8 wherein each locking passageway has a bottom side entrance that has a cross-sectional dimension larger than that of a topside entrance, the corresponding stem having a cross-sectional dimension at the bottom side entrance that is larger than a cross-sectional dimension at the topside entrance.

11. The panel assembly as recited in claim 8 wherein at least one of the locking passageways defines a transverse cross-sectional area substantially having the shape of an elongated oval, a circle, a square or an "L".

12. A panel assembly for packaged integrated circuit devices having a molded cap comprising:

a conductive substrate panel having at least one array of device areas, wherein each of the device areas contains a semiconductor die, a plurality of electrical contacts positioned adjacent to each respective semiconductor die, and a plurality of interconnecting wires that connect each respective semiconductor die to each adjacent respective electrical contact, wherein the conductive substrate panel is constructed such that a plurality of locking passageways are positioned around the periphery of the array of device areas, said locking passageways extending inwardly from a top side of the panel towards a bottom side thereof; and a molded cap that is formed over the panel topside to encapsulate the device areas of the array and the inactive device area, such that the molded cap is bonded to the device area via contact with the devices and such that the molded cap is bonded to the inactive buffer area via integrally formed, conforming locking stem portions of the molded cap that extend into each of the locking passageways such that each of the locking stems have substantially the same shape and size as the locking passageway into which each of the locking stems extend, the locking stems configured to lock the molded cap to the substrate panel such that during singulation of the device areas, the edge portions of the cap will not separate from the substrate panel and the inactive buffer area.

13. The panel assembly as recited in claim 12 wherein each locking passageway has its smallest width dimension located at a point in between the topside entrance and the bottom side entrance.

14. The panel assembly as recited in claim 12 wherein the locking stem portions of the molded cap fully expand into the locking passageways during the molding process.

15. The panel assembly as recited in claim 1 wherein each locking passageway has its smallest width dimension located at some point in between the topside entrance and the bottom side entrance.

16. The panel assembly as recited in claim 1 wherein the locking stem portions of the molded cap fully expand into the locking passageways during the molding process.

17. The panel assembly as recited in claim 8 wherein each locking passageway has its smallest width dimension located at a point in between the topside entrance and the bottom side entrance.

18. The panel assembly as recited in claim 8 wherein the locking stem portions of the molded cap fully expand into the locking passageways during the molding process.

19. A panel assembly as recited in claim 15, wherein the topside entrance and the bottom side entrance of each locking passageway have widths larger than the smallest width dimension such that each locking passageway and locking stem have an hourglass shape.

20. A panel assembly as recited in claim 17, wherein the topside entrance and the bottom side entrance of each locking passageway have widths larger than the smallest width dimension such that each locking passageway has an hourglass shape.

21. A panel assembly as recited in claim 13, wherein the topside entrance and the bottom side entrance of each locking passageway have widths larger than the smallest width dimension such that each locking passageway and locking stem have an hourglass shape.

* * * * *